(12) United States Patent
Richter et al.

(10) Patent No.: US 9,754,951 B2
(45) Date of Patent: Sep. 5, 2017

(54) SEMICONDUCTOR DEVICE WITH A MEMORY DEVICE AND A HIGH-K METAL GATE TRANSISTOR

(71) Applicant: GLOBALFOUNDRIES Inc., Grand Cayman (KY)

(72) Inventors: Ralf Richter, Dresden (DE); Sven Beyer, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 4 days.

(21) Appl. No.: 14/982,228

(22) Filed: Dec. 29, 2015

(65) Prior Publication Data

US 2017/0125432 A1   May 4, 2017

Related U.S. Application Data

(60) Provisional application No. 62/248,723, filed on Oct. 30, 2015.

(51) Int. Cl.

| | | |
|---|---|---|
| *H01L 27/115* | (2017.01) | |
| *H01L 27/11531* | (2017.01) | |
| *H01L 29/06* | (2006.01) | |
| *H01L 29/423* | (2006.01) | |
| *H01L 27/11521* | (2017.01) | |
| *H01L 21/762* | (2006.01) | |

(52) U.S. Cl.
CPC .. *H01L 27/11531* (2013.01); *H01L 21/76283* (2013.01); *H01L 27/11521* (2013.01); *H01L 29/0649* (2013.01); *H01L 29/42328* (2013.01)

(58) Field of Classification Search
CPC combination set(s) only.
See application file for complete search history.

(56) References Cited

U.S. PATENT DOCUMENTS

| | | | |
|---|---|---|---|
| 2005/0087892 A1 | 4/2005 | Hsu et al. | |
| 2007/0241386 A1* | 10/2007 | Wang | H01L 27/105 257/314 |
| 2015/0035040 A1* | 2/2015 | Yoo | H01L 29/7881 257/320 |
| 2015/0054044 A1* | 2/2015 | Perera | H01L 21/28273 257/314 |
| 2015/0123186 A1* | 5/2015 | Ho | H01L 27/11521 257/316 |
| 2015/0187780 A1* | 7/2015 | Chiu | H01L 27/11521 257/316 |
| 2015/0263040 A1* | 9/2015 | Su | H01L 27/1203 257/322 |
| 2016/0163722 A1 | 6/2016 | Chang et al. | |

OTHER PUBLICATIONS

Office Action from related U.S. Appl. No. 15/140,616 dated Sep. 12, 2016.

* cited by examiner

*Primary Examiner* — Kyoung Lee
*Assistant Examiner* — Ratisha Mehta
(74) *Attorney, Agent, or Firm* — Amerson Law Firm, PLLC

(57) ABSTRACT

A method of manufacturing a semiconductor device is provided which includes providing a semiconductor layer having a first area and a second area separated from the first area by an isolation structure, forming a protection layer on the isolation structure, forming at least partly a memory device in and on the first area, removing the protection layer, and forming a field effect transistor (FET) in and over the second area after the removal of the protection layer.

20 Claims, 5 Drawing Sheets

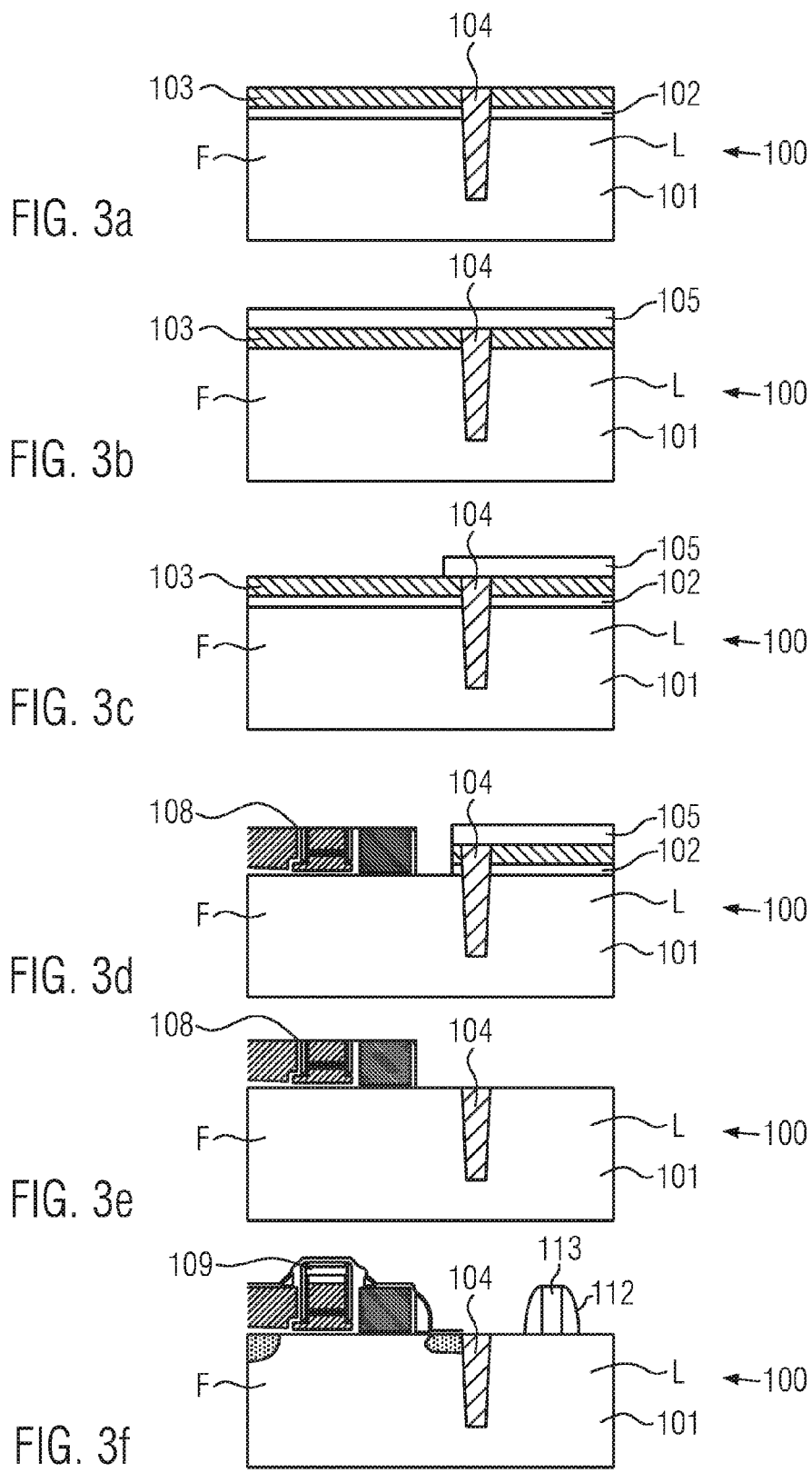

SEMICONDUCTOR DEVICE WITH A MEMORY DEVICE AND A HIGH-K METAL GATE TRANSISTOR

BACKGROUND OF THE INVENTION

1. Field of the Invention

Generally, the present disclosure relates to the field of integrated circuits and semiconductor devices and, more particularly, to the manufacture of flash memory devices in the context of high-k/metal gate first technologies for manufacturing transistor devices.

2. Description of the Related Art

The fabrication of advanced integrated circuits, such as CPUs, storage devices, application specific integrated circuits (ASICs) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors (FETs), wherein, for many types of complex circuitry, MOS technology is currently one of the most promising approaches due to the superior characteristics in view of operating speed and/or power consumption and/or cost efficiency. During the fabrication of complex integrated circuits using, for instance, CMOS technology, millions of N-channel transistors and P-channel transistors are formed on a substrate including a crystalline semiconductor layer.

There are basically two well-known processing methods for forming a planar or 3D transistor with a high-k metal gate (HKMG) structure. In the replacement gate technique, a so-called "dummy" or sacrificial gate structure is initially formed and remains in place as many process operations are performed to form the device, for example, the formation of doped source/drain regions, performing an anneal process to repair damage to the substrate caused by the ion implantation processes and to activate the implanted dopant materials. At some point in the process flow, the sacrificial gate structure is removed to define a gate cavity where the final HKMG gate structure for the device is formed. Using the "gate first" technique (HKMG first), on the other hand, involves forming a stack of layers of material across the substrate, wherein the stack of materials includes a high-k gate insulation layer, one or more metal layers, a layer of polysilicon, and a protective cap layer, for example, silicon nitride. One or more etching processes are performed to pattern the stack of materials to thereby define the basic gate structures for the transistor devices.

A flash memory device (for example, a FLASH EPROM or FLASH EEPROM) is a semiconductor device that is formed from an array of memory cells (devices), with each cell having a floating gale transistor. Flash memory chips fall into two main categories, namely, those having a so-called "NOR" architecture and those having a so-called "NAND" architecture. Data can be written to each cell within the array, but the data is erased in blocks of cells. Each floating gate transistor comprises a source, drain, floating gate and control gate. The floating gate uses channel hot electrons for writing from the drain and tunneling for erasure from the source. The sources of each floating gate in each cell in a row of the array are connected to form a source line. In embedded memory solutions, memory cells are provided in the neighborhood of logic devices and are, particularly, together with the logic devices on a single (monolithic) silicon substrate. Flash memory devices are used in many applications, including hand-held computing devices, wireless telephones and digital cameras, as well as automotive applications. To enable the individual memory elements of a flash memory chip to maintain the physical state with which they have been programmed, each memory region must be isolated from its neighboring regions, typically, by shallow trench isolations.

Whereas flash cell integration in the context of manufacturing of field effect transistors (FETs) with silicon-oxynitride gate dielectrics can be reliably achieved, integration of flash cells in HKMG technology used for the formation of FETs still poses challenging problems. After patterning, the metal gate electrodes have to be protected against cleaning processes by encapsulation and the gate dielectric layers are to be protected against oxidation as far as possible in order to avoid significant variations of the threshold voltages of the FETs. Reliable encapsulation by sidewall spacers demands a smooth topology over active and shallow trench isolation regions of the wafer. These aspects have to be taken into account when considering the integration of memory cells within the HKMG technology used for the formation of FETs.

A variety of single gate and split gate solutions for embedded memory cell architectures are known in the art. FIG. 1 illustrates an embedded super flash cell that is known in the prior art. The cell is formed on a semiconductor substrate 11 wherein source/drain regions 12 are formed. The cell comprises a floating gate 13, a control gate 14, an erase gate 15 and a select gate 16 formed by a word line. All gates may be made of polysilicon and they are covered by a multilayer insulation structure 17. The multilayer insulation structure 17 comprises parts of spacer structures formed on the tops and sidewalls of the gates. The floating gate 13 is formed over a floating gate oxide layer 18 and it is separated from the erase gate 15 by a tunnel oxide layer 18a that may be formed of the same material as the floating gate oxide layer 18. The control gate 14 and the floating gate 13 are separated from each other by an isolation layer 19, for example, an oxide-nitride-oxide (ONO) layer provided in order to enhance the capacitive coupling between the floating gate 13 and the control gate 14.

Whereas memory cells as the one illustrated in FIG. 1 are considered to be reliable operating devices, they cannot be readily integrated in the conventional process flow of HKMG technologies. According to the conventional process flow, a floating gate layer is formed over a semiconductor substrate (in particular, on a floating gate oxide formed on the surface of the semiconductor substrate). A shallow trench isolation (STI) is formed in the semiconductor substrate and the floating gate layer is patterned. The STI separates a region designated for the formation of logic devices from a region designated for the formation of a memory cell. The subsequently performed flash cell formation/patterning includes the deposition of an ONO layer (oxide-nitride-oxide) on the patterned floating gate layer and the deposition of a control gate layer on the ONO layer followed by patterning of the control gate layer. Further processing includes spacer formations and removals, formation of an erase gate layer and a tunnel oxide and the patterning of the erase gate layer. A select gate and a logic gate of a logic device are formed by deposition and patterning of a suitable material layer. Silicidation of electrodes and electrically contacting the silicided electrodes (gate, source, drain) as well as some Back-End-of-Line processing follow.

This overall conventional processing has a severe impact on the topology of the STI area. Between the deposition of the control gate layer and the patterning of the select gate, many etching and cleaning steps are needed that affect the STI area, giving rise to an uneven STI. The uneven topology of the STI area leads to some remaining HKMG material outside the gate electrode stack in the logic area after gate patterning. This residual HKMG material cannot be properly covered by sidewall spacers formed to protectively encapsulate the gate electrode-high-k gate dielectric stack. The residual high-k material outside the stack must be removed by a cleaning step before halo implantation, implantation of source/drain extension regions, etc. However, this cleaning step removes not only high-k material outside the stack but also material of the high-k gate dielectric below the gate electrode of the FET that is formed in the logic area of the wafer, thereby heavily affecting operation and reliability of the resulting semiconductor device.

In view of the situation described above, the present disclosure provides a technique of forming a semiconductor device comprising memory cells integrated within HKMG technologies without causing a pronounced STI topology and, thereby, resulting in an improved reliability and enhanced operational characteristics of the resulting semiconductor device.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the subject matter disclosed herein relates to the manufacturing of a semiconductor device, for example, an FDSOI semiconductor device, comprising a memory device, in particular, a non-volatile memory device, and a FET, wherein the FET is an HKMG FET comprising a FET gate formed over a high-k dielectric layer. The FET gate may comprise a metal material and a polysilicon material formed over the metal material. The high-k dielectric layer has a dielectric constant k larger than silicon oxide, particularly, with k>5, k>0 or k>13. Due to the particular manufacturing technique disclosed herein, the formation of the memory device, in particular, a split gate memory device, may be integrated in the gate first process flow of manufacturing an HKMG FET.

A method of manufacturing a semiconductor device includes providing a semiconductor layer having a first area and a second area separated from the first area by an isolation structure, forming a protection layer on the isolation structure (for example, an STI), forming at least partly a memory device in and on the first area, removing the protection layer and forming a field effect transistor (FET) in and over the second area after the removal of the protection layer.

Moreover, a method of manufacturing a semiconductor device is provided including forming an isolation region in a semiconductor layer to separate a first area of the semiconductor layer from a second area of the semiconductor layer, forming a floating gate layer over the first area, forming a protection layer over the isolation region, forming a control gate layer over the floating gate layer formed over the first area, and forming a select gate layer and an erase gate layer over the first area. The floating gate layer, the control gate layer, the select gate layer and the erase gate layer are patterned to form a floating gate, control gate, select gate and erase gate, respectively. The protection layer is removed and, after removal of the protection layer, a field effect transistor is formed. Formation of the FET includes forming a gate dielectric over the second area and forming a transistor gate over the gate dielectric. It is noted that the select gate may be formed such that it partially overlaps the control gate.

BRIEF DESCRIPTION OF THE DRAWINGS

The disclosure may be understood by reference to the following description taken in conjunction with the accompanying drawings, in which like reference numerals identify like elements, and in which:

FIGS. 3a-3f show an exemplary process flow in accordance with the present disclosure wherein a protection layer is formed on an STI region and a logic area;

Figure 1:
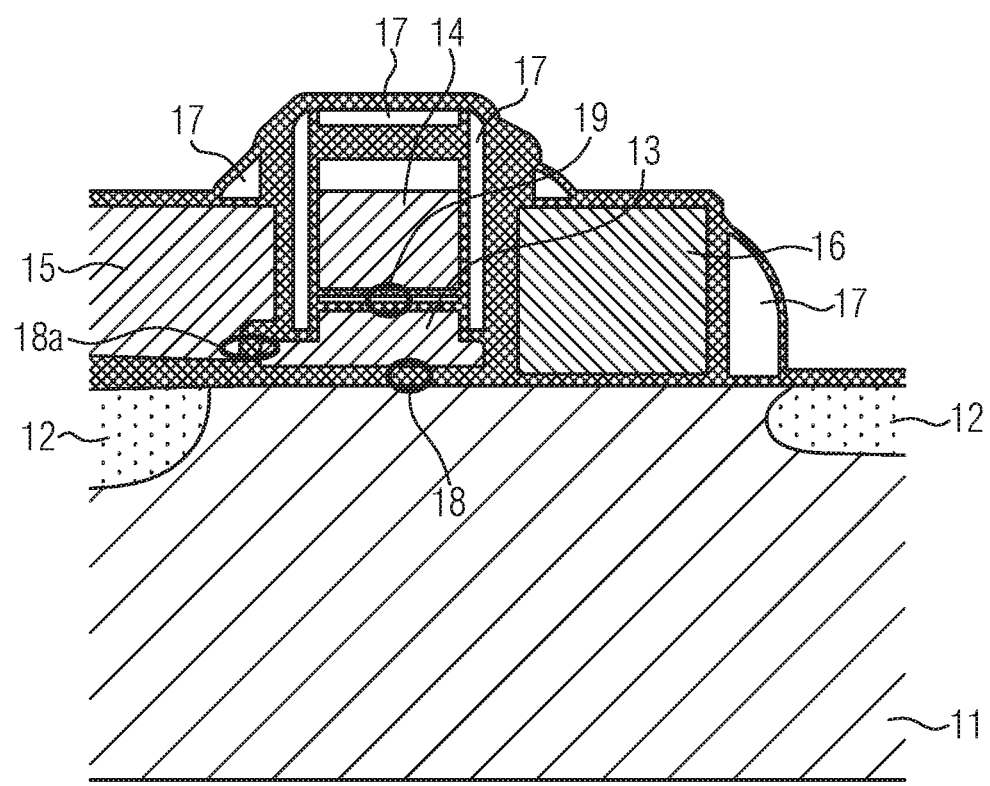
FIG. 1 illustrates a memory device of the art.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the disclosure. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Generally, manufacturing techniques and semiconductor devices in which N-channel transistors and/or P-channel transistors and memory cells may be formed are described herein. The manufacturing techniques may be integrated in CMOS manufacturing processes. As will be readily apparent to those skilled in the art upon a complete reading of the present application, the present method is applicable to a variety of technologies, for example, NMOS, PMOS, CMOS, etc., and is readily applicable to a variety of devices, including, but not limited to, logic devices, memory devices, SRAM devices etc., in principle. The techniques and technologies described herein may be utilized to fabricate MOS integrated circuit devices, including NMOS integrated circuit devices, PMOS integrated circuit devices, and CMOS integrated circuit devices. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor substrate.

Figure 2:
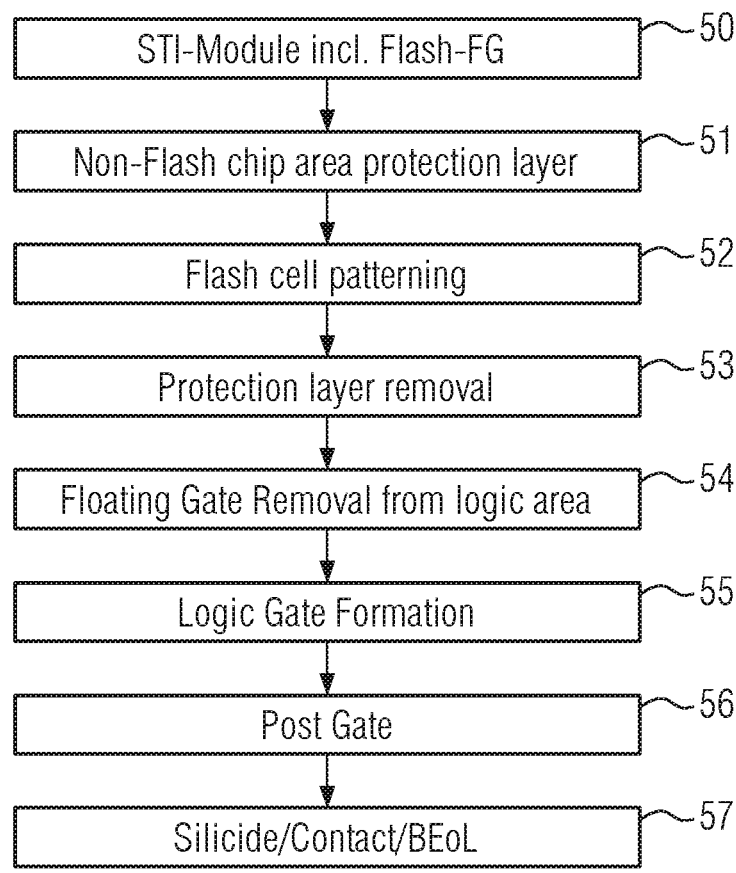
FIG. 2 shows a flow chart of an exemplary processing according to the present disclosure.

The present disclosure generally provides techniques for the formation of logic devices and memory cells wherein high-k metal gate (HKMG) first ("gate-first") processing techniques are employed. In particular, various examples or process flows are disclosed herein wherein the formation of a memory device (cell) is integrated into the process flow of the formation of an HKMG FET. The memory cell may be or includes a flash memory, a floating body storage transistor, a FLASH EPROM or a FLASH EEPROM, etc. FIG. 2 shows a flow chart of one illustrative example of the technique provided herein. As indicated in block 50, the process begins with performing an STI-Module that includes means for the formation of a floating gate of a flash memory cell to form a shallow trench isolation (STI) and to deposit a floating gate layer and pattern the same in order to remove it from the STI or a region where the STI is formed after deposition of the floating gate layer. In one illustrative embodiment, the STI separates an area designated for the formation of logic devices, particularly, FETs, i.e., a logic area, from an area designated for the formation of a memory cell, i.e., a (flash) memory area. The floating gate layer may be deposited over the flash memory area, the STI and the logic area before patterning. As indicated in block 51, a protection layer is formed over the patterned floating gate layer in the logic area and over the STI.

After formation of the protection layer and removal of the same from the flash memory area, a process of flash cell formation/patterning process, as shown in block 52, is performed for the flash memory area. The flash cell formation/patterning process 52 comprises a deposition of one or more layers of insulation material, for example, an ONO (oxide-nitride-oxide) layer, on or over the patterned floating gate layer and the deposition of a control gate layer of material on the insulation layer, followed by patterning of the control gate layer and a final floating gate patterning wherein parts of the floating gate layer formed over the flash memory area that are not covered by the patterned control gate layer are removed. It is noted that a metal layer may be formed between the floating gate layer and the insulation layer in order to increase erase performance. Further processing includes spacer formations and removals, deposition and patterning of an erase gate layer and formation of a tunnel oxide separating the floating gate from the erase gate. Local oxidation processes may be performed to obtain electrical isolations as considered appropriate. A select gate is formed by deposition and patterning of a select gate layer.

As illustrated in FIG. 2, the flash cell formation/patterning process 52 is followed by performing a process 53 to remove the protection layer from the STI and the logic area. As indicated in block 54, the next operation involves removal of the floating gate layer from the logic area. Afterwards, as indicated in block 55, the gate electrode (logic gate) material layer(s) of a FET device is formed over the logic area. The logic gate may comprise a metal material and it may be formed on a gate dielectric formed by the deposition and patterning of a high-k material (wherein the high-k material has a k value of at least 10). Sidewall spacers may be formed at sidewalls of the logic gate. As indicated in block 56, some post gate processing, including the implantation of dopants and annealing processes to form source/drain regions, source/drain extension regions, etc., may be performed. The post gate processing may include the formation of source/drain regions, source/drain extension regions and halo regions in SOI applications. As indicated in block 57, silicidation of source/drain regions and/or the logic gate and Back-End-of-Line processing may then be performed.

According to the example shown in FIG. 2, an HKMG—gate first process—may be applied to form a FET device over and in the logic area after removal of the protection layer from the logic area. The etch/clean processes involved in the formation of a memory device over and in the flash memory area may be completely decoupled from the ones involved in the formation of FETs over and in the logic area by the provision of the protection layer and, thus, compatibility of the process flow of the formation of memory devices in the flash memory area with the HKMG first process carried out for the logic area may be achieved.

In the process flow illustrated in FIG. 2, an array of memory cells, each arranged in rows and columns and each comprising a split gate non-volatile memory device, may be formed.

Further exemplary process flows in accordance with the present disclosure are illustrated in FIGS. 3a-3f and 4a-4e.

In the manufacturing stage shown in FIG. 3a, a semiconductor device 100 comprises a semiconductor layer 101, an oxide layer 102 formed on the semiconductor layer 101 and a floating gate layer 103 formed over the oxide layer 102. An STI region 104 separates a flash memory area "F" where a memory device is to be formed from a logic area "L" where a FET is to be formed. The floating gate layer 103 is patterned such that it is removed from the STI region 104 if the STI is formed before deposition of the floating gate layer 103. Alternatively, the floating gate layer 103 is deposited before formation of the STI 104 and patterned to expose a region of the semiconductor layer 101 where the STI 104 is not to be formed.

The semiconductor layer 101 may be comprised of any appropriate semiconductor material, such as silicon, silicon/germanium, silicon/carbon, other II-VI or III-V semiconductor components and the like. The semiconductor layer may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon and the like. It goes without saying that the disclosure herein is not limited to this kind of choice of material. The semiconductor layer 101 may have a thickness in the range of 10-50 nm, for example. The semiconductor layer 101 may be part of a silicon-on-insulator (SOI) substrate or a fully depleted SOI (FDSOI) substrate and may be formed on a buried oxide layer, for example, including silicon dioxide, silicon nitride. The (FD)SOI substrate may comprise a bulk semiconductor substrate below a buried oxide layer and may be made of or comprise silicon substrate, in particular, a single crystal silicon substrate, germanium, silicon germanium, gallium phosphate or gallium arsenide, etc.

The oxide layer 102 may comprise a silicon oxide material, for example. The floating gate layer 103 may comprise polysilicon. The STI 104 may be formed by etching a trench in the semiconductor layer 101 and filling the trench with some oxide material. Before or after the formation of the STI 104, the semiconductor layer 101 may be subjected to ion implantation to define a basic dopant concentration in the same.

As discussed above, the protection layer 105 is formed over the floating gate layer 103, as shown in FIG. 3*b*. The protection layer 105 may be made of or comprise SiN. The protection layer 105 may be formed after patterning of the floating gate layer 103. The protection layer 105 is patterned to substantially remove it from the flash memory area F, as shown in FIG. 3*c*. The protection layer 105, particularly, protects the STI 104 during the process flow of forming a memory device over and in the flash memory area F. It is noted that, whereas FIGS. 3*a*-3*c* show a process flow wherein the floating gate layer 103 is formed before the formation of the protection layer 105, it may, alternatively, be formed over the flash memory area F after the formation of the protection layer 105 on the STI 104.

FIG. 3*d* shows the semiconductor device 100 in a further developed manufacturing stage. After removal of the protection layer 105 from the flash memory area F, a memory device 108 similar to the one shown in FIG. 1 is formed in and on the flash memory area F (see FIGS. 3*d*-3*f*). In FIGS. 3*d*-3*f*, the memory device is merely shown in a symbolic representation that is not to scale, particularly, not to scale with the individual layers 102, 103, 105.

As described with reference to FIG. 1, for example, an ONO layer, and a control gate layer are subsequently formed over the floating gate layer 103, and the floating gate layer 103, the insulation layer and the control gate layer are patterned to obtain a control gate and a floating gate and an (inter-gate) insulation layer separating theses gates from each other. The control gate layer may comprise polysilicon and the insulation layer comprises silicon oxide and silicon nitride. The formation and partial removal of several spacer structures may contribute to the insulation structures. Moreover, a tunnel oxide, an erase gate and a select gate (that may represent part of a word line) are formed. The erase gate and the select gate may comprise polysilicon. The floating gate may be spaced apart from the select gate and the erase gate and isolated from these gates. The control gate may also be spaced apart from the select gate and the erase gate and isolated from these gates. The erase gate has a portion that overhangs partially the floating gate.

FIG. 3*e* shows the semiconductor device 100 in a further developed manufacturing stage wherein both the protection layer 105 and the floating gate layer 103 are removed from the STI 104 and the logic area L. A gate electrode 113 of a logic device (logic gate), for example, an N-channel or P-channel MOSFET, is formed in the logic area L, as shown on FIG. 3*f*. In the depicted example, sidewall spacers 112 are formed at sidewalls of the logic gate 113. Formation of the sidewall spacers 112 may contribute to a multilayer insulating layer that covers the control gate and/or a sidewall of a select gate of the memory device. The sidewall spacers 112 may include silicon dioxide and/or silicon nitride. The sidewall spacer 112 may be provided in the form of a multilayer by subsequently epitaxially growing or depositing the respective layers on the sidewalls of the logic gate 113 and appropriately etching them.

The logic gate 113 of the logic device formed over and in the logic area L may be made of or comprise a metal gate layer comprising a plurality of layers that may include Al, AlN or TiN. The logic gate 113 may comprise a polysilicon gate layer formed over the metal gate layer. In particular, the metal gate layer may comprise a work function adjusting material that comprises an appropriate transition metal nitride, for example, those from groups 4-6 in the periodic table, including, for example, titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN) and the like, with a thickness of about 1-60 nm, i.e., the work function adjusting layer may be integrated in metal gate layer.

The logic gate 113 may be formed over a high-k dielectric layer, for example, with a dielectric constant $k>5$, $k>9$ or $k>13$, that may comprise a transitional metal oxide, such as at least one of hafnium oxide, hafnium dioxide and hafnium silicon-oxynitride. According to some exemplary embodiments, the high-k dielectric layer may be formed over the logic area L directly on the semiconductor layer 101. According to other embodiments, the high-k dielectric layer may be formed on an insulating layer (not shown) comprising silicon oxide which is formed on the semiconductor layer 101, for example, on or over oxide layer 102. Post gate processing to form, for example, source/drain regions are performed.

Since in the process flow illustrated in FIGS. 3*a*-3*f* the STI 104 (in addition to the logic area L) is protected by the protection layer 105 (as well as the part of the floating gate layer 103 when formed over the logic area L) against etching and cleaning processes involved in the manufacturing of the memory device over and in the flash memory area F, the topography of the STI 104 is not affected by these processes. Thus, an almost flat surface of the STI and the adjacent region in the logic area L can be achieved and, therefore, the above-described problems related to the high-k material used during the HKMG first processing over and in the logic area are alleviated significantly.

It is noted that whereas in the above-described example, patterning of a select gate layer to form a select gate may be performed before removal of the protection layer 105 and formation of the logic gate 113, alternatively, a select gate and the logic gate 113 may be formed during the same patterning step (and possibly by patterning of the same material layer) after removal of the protection layer 105. The memory device 109 formed in and on the flash memory area F as shown in FIG. 3f may be similar to the one shown in FIG. 1.

FIGS. 4a-4e show an alternative process flow as compared to the one illustrated in FIGS. 3a-3f. Similar to the example shown in FIG. 3a, in a manufacturing stage shown in FIG. 4a a semiconductor device 200 comprises a semiconductor layer 201, an oxide layer 202 formed on the semiconductor layer 201 and a floating gate layer 203 formed over the oxide layer 202. An STI region 204 separates a flash memory area F where a memory device is to be formed from a logic area L where a FET is to be formed. The specifications described above with reference to the corresponding components of semiconductor device 100 may also apply to the components of semiconductor device 200 illustrated in the FIGS. 4a-4e.

Figure 4A:
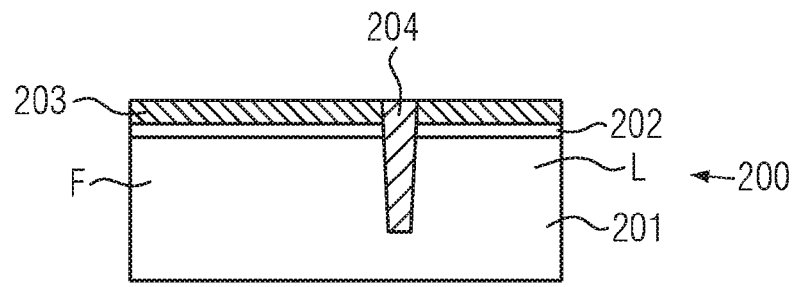
FIGS. 4a-4e show an exemplary process flow in accordance with the present disclosure wherein a protection layer is formed by means of a control gate layer, ONO layer and floating gate layer on an STI region and a logic area.
Figure 4B:
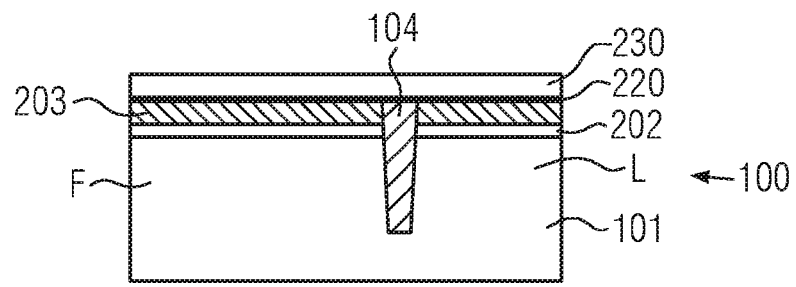
Figure 4C:
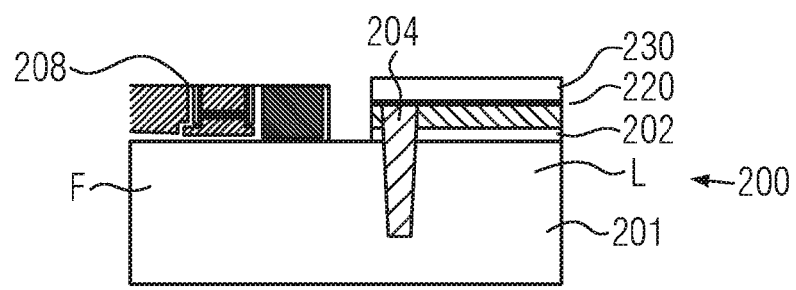
Figure 4D:
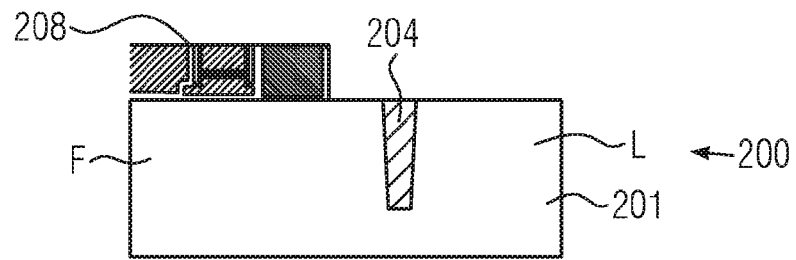
Figure 4E:
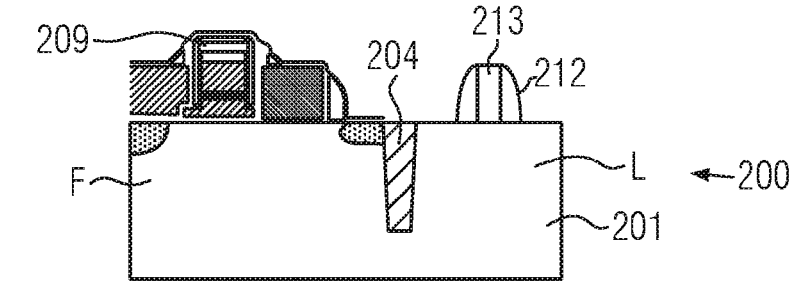

In the manufacturing stage shown in FIG. 4b, an insulation layer 220 and a control gate layer 230 are formed over the entire structure shown in FIG. 4a. For exemplary purposes, in the following, it is assumed that the insulation layer 220 is an ONO layer without restricting the disclosed example to this particular case. Different from the example described with reference to FIGS. 3a-3f, in this example, the ONO layer 220 and the control gate layer 230 are not removed from the STI 204 and the logic area L. Over and in the flash memory area F, a memory device 208, for example, a memory device similar to the one shown in FIG. 1, may be formed (see FIGS. 4c-4e). In FIGS. 4c-4e, the memory device is merely shown in a symbolic representation that is not to scale, particularly, not to scale with the individual layers 202, 203, 220, 230.

The STI 204 and the logic area L are protected against etching and cleaning steps involved in the formation of a memory device over and in the flash memory area F by the ONO layer 220 and the control gate layer 230 playing the role of protection layer 105 of the example shown in FIGS. 3a-3f d.

After patterning of the different gate layers, a memory device comprising source/drain regions, a tunnel oxide, a floating gate, a control gate separated from the floating gate by a part of the (inter-gate) ONO layer 220, an erase gate and a select gate are formed over the flash memory area F. A memory device 208, 209 similar to the one shown in FIG. 1 may be formed (see FIGS. 4c-4e). The ONO layer 220 and the control gate layer 230 are removed from the STI 204 and the logic area L (see FIG. 4d) and the HKMG gate first process flow may be performed in order to form a FET comprising a gate 213 and sidewall spacers 212 over and in the logic area L, as shown in FIG. 4e. Formation of the sidewall spacers 212 may contribute to the formation of an insulation structure of the memory device formed over and in the flash memory area F. It is noted that the patterning of a select gate layer in order to form a select gate and patterning of a logic gate layer in order to form the gate 213 of the FET formed over and in the logic area may be performed during the same processing step after removal of the protecting layers 220 and 230 from the logic area L. In this case, the ONO layer 220 protects the STI at the end of the flash cell patterning process.

Since, in the process flow illustrated in FIGS. 4a-4e, the STI 204 (in addition to the logic area L) is protected by the ONO layer 220 and the control gate layer 230 against etching and cleaning processes involved in the manufacturing of the memory device over and in the flash memory area F, the topography of the STI 204 is not affected by these processes. Thus, an almost flat surface of the STI 204 and the adjacent region in the logic area L may be achieved and, therefore, the above-described problems related to the high-k material used during the HKMG first processing over and in the logic area L are alleviated significantly. As compared to the example described with reference to FIGS. 3a-3e deposition, the need for lithography and etching of an additional protection layer may be avoided and, thus, the overall processing can be simplified.

Figure 5:
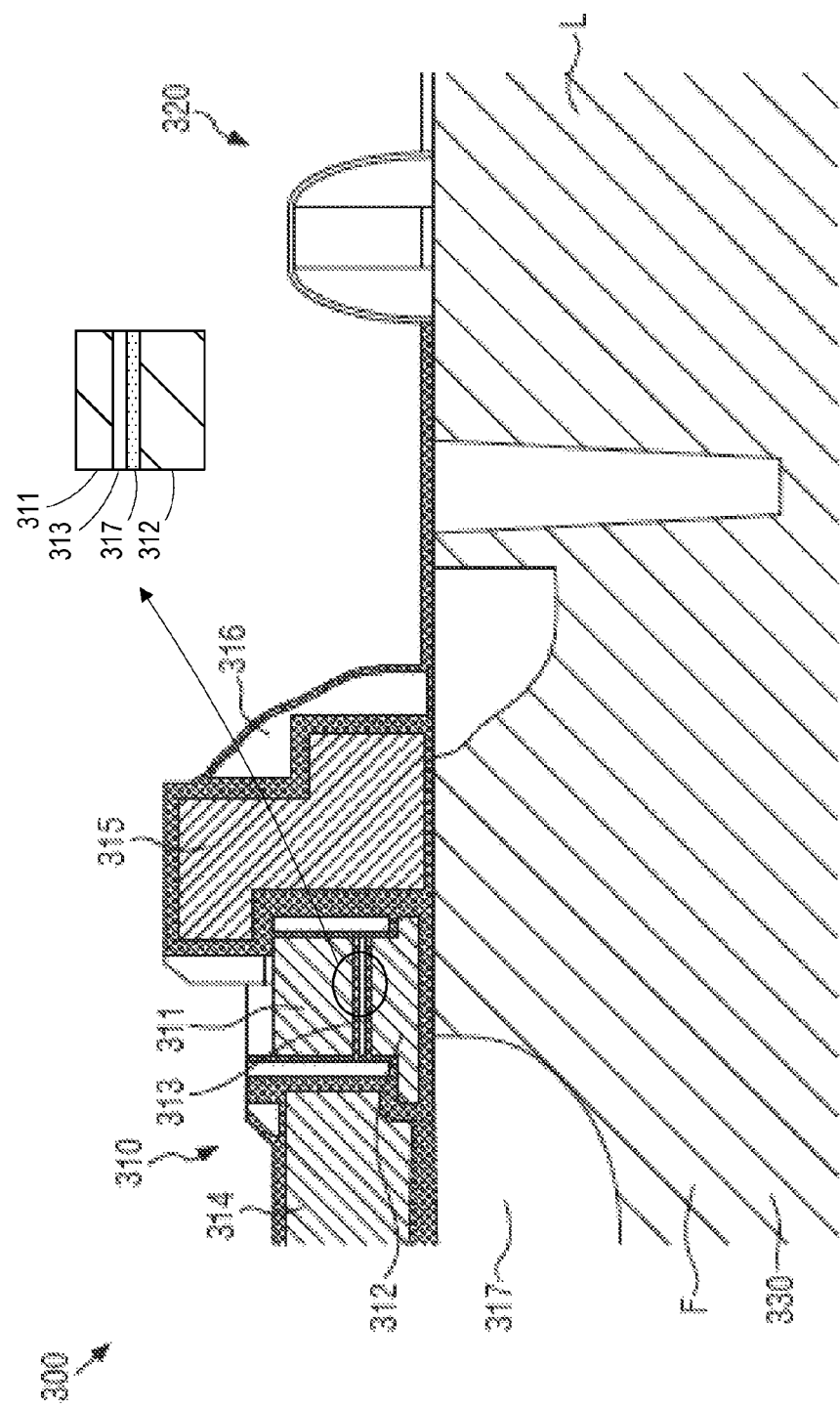
FIG. 5 illustrates a semiconductor device that may be formed in accordance with a process flow similar to the one shown in FIGS. 3a-3f or the one shown in FIGS. 4a-4e wherein a memory device comprises a select gate partially overlapping a control gate.

The above-described examples are not particularly restricted to a particular kind of memory device. In the above-described examples, a memory device may be formed wherein the select gate partially overlaps the control gate. Moreover, at the end of the described process flows, the ONO layer may represent the final protection layer for the non-flash memory areas. In particular, the select gate may be formed after removal of the protecting layer(s) from the logic area L. FIG. 5 illustrates in some detail a semiconductor device 300 comprising a memory device 310 formed in and on a flash memory area F of a semiconductor layer 330 and a FET 320 formed in and on a logic area L of the semiconductor layer 330. The memory device 310 comprises a control gate 311 formed over a floating gate 312 and separated therefrom by an ONO layer 313. Moreover, the memory device 310 comprises an erase gate 314 and a select gate 315 formed to partially overlap the control gate 311. The memory device 310 comprises an isolation structure 316 that might partially be formed during the process of forming sidewall spacers of the FET device 320. A metal layer 317 may be formed between the floating gate layer and the insulation layer, as illustrated in the expanded view.

In the process flows illustrated in FIGS. 3a to 4e, an array of memory cells each arranged in rows and columns and each comprising a split gate memory device may be formed. Moreover, columns of memory cells separated by columns of isolation regions in an interlaced fashion may be formed. Each column of memory cells may contain a pair of the memory devices as the ones shown over and in logic areas of a wafer in FIGS. 3f and 4e and each pair of memory devices may share the same source region and adjacent pairs may share the same drain region. Select gates for an entire row of memory cells may be formed as a single conductive word line, such that each word line forms a select gate for one of the memory devices in each column of the memory cells (e each word line electrically connects together a row of the select gates). Control gates may be similarly formed as a continuous control gate line extending along the row of memory cells (i.e., electrically connecting together a row of the control gates), and the erase gates may also be formed as a continuous erase gate line extending along the row of memory cells (i.e., electrically connecting together a row of the erase gates).

As a result, the present disclosure provides techniques for the integration of the formation of a split gate memory device in the HKMG first manufacturing of HKMG FETs. Thereby, the manufacturing of reliably operating semiconductor devices comprising memory cells and logic devices may be significantly improved as compared to the art.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of manufacturing a semiconductor device, comprising:
    providing a semiconductor layer comprising a first area and a second area separated from said first area by an isolation structure;
    forming a protection layer above said isolation structure and said first and second areas, wherein said protection layer comprises an insulating layer and a control gate layer;
    removing said protection layer from above said first area;
    at least partially forming a memory device in and on said first area after removing said protection layer from above said first area, wherein said protection layer remains in place above said isolation structure and said second area during a patterning of at least one of a control gate or a floating gate of the memory device, wherein forming said memory device comprises forming a control gate from a part of said control gate layer, forming a floating gate and forming an inter-gate insulating layer between said control gate and said floating gate from a part of said insulating layer;
    removing said protection layer from above said isolation structure and said second area after the patterning of said at least one of said control gate or said floating gate; and
    forming a field effect transistor (FET) in and over said second area after said removal of said protection layer from above said second area.

2. The method of claim 1, wherein said isolation structure is a shallow trench isolation (STI).

3. The method of claim 1, wherein said memory device is a split gate device and wherein forming said memory device comprises forming a floating gate by depositing and patterning a floating gate layer, forming a control gate by depositing and patterning a control gate layer, forming an erase gate by depositing and patterning an erase gate layer and forming a select gate by depositing and patterning a select gate layer, wherein, in particular, said select gate is formed so as to partially overlap said control gate.

4. The method of claim 1, wherein forming said FET comprises forming a high-k dielectric layer over said semiconductor layer and forming a FET gate comprising a metal material over said high-k dielectric layer.

5. The method of claim 1, wherein forming said FET comprises forming a FET gate and wherein forming said memory device comprises forming a select gate and wherein at least a part of said FET gate and said select gate are patterned from a gate layer in a same patterning process after removal of said protection layer.

6. A method of manufacturing a semiconductor device, comprising:
    forming an isolation structure in a semiconductor layer to separate a first area of said semiconductor layer from a second area of said semiconductor layer;
    forming a protection layer over said isolation structure;
    forming a memory device in and over said first area, comprising:
        forming a floating gate layer over said first area;
        forming a control gate layer over said floating gate layer formed over said first area;
        forming a select gate layer and an erase gate layer over said first area; and
        patterning said floating gate layer, said control gate layer, said select gate layer, and said erase gate layer to form a floating gate, control gate, select gate, and erase gate, respectively, wherein forming said protection layer comprises forming said control gate layer over said isolation structure;
    removing said protection layer after patterning said floating gate layer, said control gate layer, said select gate layer, and said erase gate layer; and
    forming a field effect transistor (FET) in and over said second area after said removal of said protection layer, comprising forming a gate dielectric over said second area and forming a transistor gate over said gate dielectric.

7. The method of claim 6, wherein said isolation structure is a shallow trench isolation (STI).

8. The method of claim 6, wherein said protection layer is also formed over said second area.

9. The method of claim 6, wherein forming said protection layer comprises forming an insulation layer over said first area, said second area and said isolation structure and forming said control gate layer over said insulation layer over said isolation structure and said second area and wherein a part of said insulation layer is arranged between said control gate and said floating gate.

10. The method of claim 6, further comprising forming an oxide-nitride-oxide layer between said control gate and said floating gate.

11. The method of claim 6, further comprising forming an oxide-nitride-oxide layer between said control gate and said floating gate and forming a metal layer between said floating gate and said oxide-nitride-oxide layer.

12. The method of claim 6, wherein said erase gate is formed to partially overlap said floating gate.

13. The method of claim 6, wherein at least a part of said transistor gate and said select gate are patterned from a gate layer in a same patterning process after said removal of said protection layer.

14. The method of claim 6, further comprising forming source/drain regions in said first and second areas after said removal of said protection layer.

15. The method of claim 6, wherein said gate dielectric is a high-k dielectric.

16. The method of claim 6, wherein forming said transistor gate comprises forming a metal gate layer over said gate dielectric and forming a polysilicon gate layer over said metal gate layer.

17. A method of manufacturing a semiconductor device, comprising:

providing a semiconductor layer comprising a first area and a second area separated from said first area by an isolation structure;

forming a protection layer above said isolation structure and said first and second areas;

removing said protection layer from above said first area;

at least partially forming a memory device in and on said first area after removing said protection layer from above said first area, wherein said protection layer remains in place above said isolation structure and said second area during a patterning of at least one of a control gate or a floating gate of said memory device;

removing said protection layer from above said isolation structure and said second area after said patterning of said at least one of said control gate or said floating gate; and forming a field effect transistor (FET) in and over said second area after said removal of said protection layer from above said second area, wherein forming said FET comprises forming a FET gate and wherein forming said memory device comprises forming a select gate and wherein at least a part of said FET gate and said select gate are patterned from a gate layer in a same patterning process after removal of said protection layer.

18. The method of claim 17, wherein said isolation structure is a shallow trench isolation (STI).

19. The method of claim 17, wherein said memory device is a split gate device and wherein forming said memory device comprises forming a floating gate by depositing and patterning a floating gate layer, forming a control gate by depositing and patterning a control gate layer, forming an erase gate by depositing and patterning an erase gate layer and forming a select gate by depositing and patterning a select gate layer, wherein, in particular, said select gate is formed so as to partially overlap said control gate.

20. The method of claim 17, wherein forming said FET comprises forming a high-k dielectric layer over said semiconductor layer and forming a FET gate comprising a metal material over said high-k dielectric layer.

* * * * *